United States Patent
Fukuoka et al.

(10) Patent No.: US 10,964,454 B2
(45) Date of Patent: Mar. 30, 2021

(54) SUPERCONDUCTING WIRE AND SUPERCONDUCTING COIL

(71) Applicant: MITSUBISHI MATERIALS CORPORATION, Tokyo (JP)

(72) Inventors: Kosei Fukuoka, Okegawa (JP); Yuki Ito, Cambridge, MA (US); Kazunari Maki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 582 days.

(21) Appl. No.: 15/540,928

(22) PCT Filed: Dec. 22, 2015

(86) PCT No.: PCT/JP2015/085765
§ 371 (c)(1),
(2) Date: Jun. 29, 2017

(87) PCT Pub. No.: WO2016/111159
PCT Pub. Date: Jul. 14, 2016

(65) Prior Publication Data
US 2018/0005731 A1    Jan. 4, 2018

(30) Foreign Application Priority Data

Jan. 7, 2015   (JP) ............................. JP2015-001510

(51) Int. Cl.
*H01B 12/04* (2006.01)
*C22C 9/00* (2006.01)
(Continued)

(52) U.S. Cl.
CPC ............. *H01B 12/04* (2013.01); *B22D 11/00* (2013.01); *B22D 11/005* (2013.01); *B22D 11/12* (2013.01);
(Continued)

(58) Field of Classification Search
None
See application file for complete search history.

(56) References Cited

U.S. PATENT DOCUMENTS 4,233,067 A   11/1980 Sawada
4,339,508 A    7/1982 Tsuya et al.
(Continued)

FOREIGN PATENT DOCUMENTS

CN        1080779 A    1/1994
CN      101512829 A    8/2009
(Continued)

OTHER PUBLICATIONS

Vorobieva et al., "The experimental investigation of copper for superconductors", *Physica C*, 2001, pp. 371-374, vol. 354.
(Continued)

*Primary Examiner* — Paul A Wartalowicz
(74) *Attorney, Agent, or Firm* — Leason Ellis LLP

(57) ABSTRACT

The present invention is a superconducting wire including: a wire formed of a superconducting material; and a superconducting stabilization material disposed in contact with the wire, in which the superconducting stabilization material is formed of a copper material which contains: one or more types of additive elements selected from Ca, Sr, Ba, and rare earth elements in a total of 3 ppm by mass to 400 ppm by mass; a balance being Cu and inevitable impurities, and in which a total concentration of the inevitable impurities excluding O, H, C, N, and S which are gas components is 5 ppm by mass to 100 ppm by mass.

8 Claims, 5 Drawing Sheets

(51) Int. Cl.
    *H01F 6/06*           (2006.01)
    *H01B 12/02*         (2006.01)
    *B22D 11/12*         (2006.01)
    *B22D 11/00*         (2006.01)
    *H01B 12/00*         (2006.01)
    *H01B 12/06*         (2006.01)

(52) U.S. Cl.
    CPC .............. *C22C 9/00* (2013.01); *H01B 12/00* (2013.01); *H01B 12/02* (2013.01); *H01F 6/06* (2013.01); *H01B 12/06* (2013.01); *Y02E 40/60* (2013.01)

(56) References Cited

U.S. PATENT DOCUMENTS

| | | | |
|---|---|---|---|
| 8,216,442 | B2 | 7/2012 | Shindo et al. |
| 2008/0188372 | A1 | 8/2008 | Motowidlo |
| 2008/0223728 | A1 | 9/2008 | Shindo et al. |
| 2009/0272466 | A1 | 11/2009 | Shindo et al. |
| 2012/0100390 | A1 | 4/2012 | Kuroda et al. |
| 2013/0142567 | A1 | 6/2013 | Sarangapani et al. |
| 2017/0352453 | A1 | 12/2017 | Fukuoka et al. |
| 2018/0005731 | A1 | 1/2018 | Fukuoka et al. |
| 2019/0066865 | A1 | 2/2019 | Fukuoka et al. |

FOREIGN PATENT DOCUMENTS

| | | | |
|---|---|---|---|
| CN | 102453813 | A | 5/2012 |
| CN | 103378284 | A | 10/2013 |
| CN | 103534370 | A | 1/2014 |
| CN | 103985479 | A | 8/2014 |
| CN | 105189792 | A | 12/2015 |
| CN | 107002180 | A | 8/2017 |
| JP | 54-097528 | A | 8/1979 |
| JP | 60-062009 | A | 4/1985 |
| JP | 63-140052 | A | 6/1988 |
| JP | 63-235440 | A | 9/1988 |
| JP | 01-143744 | A | 6/1989 |
| JP | 02-145737 | A | 6/1990 |
| JP | 04-224662 | A | 8/1992 |
| JP | H04224662 | * | 8/1992 |
| JP | 05-025565 | A | 2/1993 |
| JP | 2006-328542 | A | 12/2006 |
| JP | 2011-236484 | A | 11/2011 |
| JP | 2014-130789 | A | 7/2014 |
| JP | 2016-125114 | A | 7/2016 |
| TW | 200518115 | A | 6/2005 |
| WO | WO-2005/073434 | A | 8/2005 |
| WO | WO-2006/134724 | A | 12/2006 |

OTHER PUBLICATIONS

International Search Report dated Mar. 8, 2016 for the corresponding PCT Application No. PCT/JP2015/085765.
Office Action dated Aug. 2, 2016 for the corresponding Japanese Patent Application No. 2015-001510.
Office Action dated Nov. 23, 2016 for the corresponding Taiwanese Patent Application No. 104144089.
Office Action dated Jan. 26, 2018 for the corresponding Chinese Patent Application No. 201580066340.7.
Stekly et al., "Stable Superconducting Coils", *IEEE*, Dec. 15, 1965, pp. 367-372, XP055468668, On Line Retrieved from the Internet: URL:https://www.google.com/url?sa=t&rct=j&q=&esrc=s&source=web&cd= 11&ved=OahUKEwjTjfWEhcbaAh WHKF AKHSUDCm04ChAWCCgwAA&url=http://epaper.kek.jp/p65/PDF/PAC1965_0367.PDF&usg= AOvVaw36EFExNWzmc5TTLhjylUv[retrieved on Apr. 19, 2018].
Extended European Search Report dated May 2, 2018 for the corresponding European Patent Application No. 15877032.1.
Office Action dated Jun. 4, 2019 for the corresponding Chinese Patent Application No. 201810575450.1.
Stekly et al., "Stable Superconducting Coils", *IEEE*, Dec. 15, 1965, pp. 367-372, XP055468668, On Line Retrieved from the Internet: URL:https://www.google.com/url?sa=t&rct=j&q=&esrc=s&source=web&cd= 11&ved=[[O]]0ahUKEwjTjfWEhcbaAh WHKF AKHSUDCm04ChAWCCgwAA&url=http://epaper.kek.jp/p65/PDF/PAC1965_0367.PDF&usg= AOvVaw36EFEx[[N]]fVWzmc5TTLhjylUv[retrieved on Apr. 19, 2018] (Previously submitted in the IDS filed May 22, 2018).
International Search Report dated Jun. 27, 2017 for the corresponding PCT International Patent Application No. PCT/JP2017/013924.
Chinese Office Action dated Aug. 27, 2019 for the corresponding Chinese Patent Application No. 201780008657.4.
Office Action dated Aug. 15, 2019 for the related U.S. Appl. No. 16/090,788.
Office Action dated Jun. 15, 2020 for the related U.S. Appl. No. 16/090,788.
European Office Action dated Jul. 6, 2020 for the corresponding European Patent Application No. 17779088.8.
Notice of Allowance dated Sep. 30, 2020 for the corresponding Chinese Patent Application No. 201780008657.4.
Korean Office Action dated Dec. 28, 2020 for the corresponding Korean Patent Application No. 10-2018-7025123.

* cited by examiner (b)

(a)

(b)

(a)

SUPERCONDUCTING WIRE AND SUPERCONDUCTING COIL

CROSS-REFERENCE TO RELATED PATENT APPLICATIONS

This application is a U.S. National Phase Application under 35 U.S.C. § 371 of International Patent Application No. PCT/JP2015/085765 filed on Dec. 22, 2015 and claims the benefit of Japanese Patent Application No. 2015-001510, filed Jan. 7, 2015, all of which are incorporated herein by reference in their entirety. The International Application was published in Japanese on Jul. 14, 2016 as International Publication No. WO/2016/111159 under PCT Article 21(2).

FIELD OF THE INVENTION

The present invention relates to a superconducting wire provided with a wire formed of a superconducting material and a superconducting stabilization material disposed in contact with the wire, and a superconducting coil formed of the superconducting wire.

BACKGROUND OF THE INVENTION

The superconducting wire described above is used in fields such as MRI, NMR, particle accelerators, maglev, and electric power storage apparatuses.

This superconducting wire has a multi-core structure in which a plurality of wires formed of a superconducting material such as Nb—Ti alloy and $Nb_3Sn$ are bundled with a superconducting stabilization material interposed therebetween. In addition, a tape-shaped superconducting wire in which a superconducting material and a superconducting stabilization material are laminated is also provided.

Here, in the superconducting wire described above, in a case where the superconducting state is destroyed in a part of the superconducting material, there is a concern that the resistance partially increases greatly, in which the temperature of the superconducting material rises and the temperature of the entire superconducting material becomes higher than the critical temperature, transitioning the superconducting state to a normal conducting state. Therefore, the superconducting wire has a structure in which a superconducting stabilization material having a relatively low resistance such as copper is disposed so as to be in contact with the superconducting material and, in a case where the superconducting state is partially destroyed, the electric current flowing through the superconducting material is temporarily diverted to the superconducting stabilization material and in the meantime the superconducting material is cooled to return to the superconducting state.

In the superconducting stabilization material described above, in order to effectively divert the electric current, it is required that the resistance at extremely low temperatures be sufficiently low. Residual resistance ratio (RRR) is widely used as an indicator of electric resistance at extremely low temperatures. The residual resistance ratio (RRR) is the ratio $\rho_{293K}/\rho_{4.2K}$ of the resistance $\rho_{293K}$ at normal temperature (293 K) to the resistance $\rho_{4.2K}$ at liquid helium temperature (4.2 K), and the higher the residual resistance ratio (RRR), the better the performance as a superconducting stabilization material.

Therefore, for example, Japanese Unexamined Patent Application, First Publication No. 2011-236484 and Japanese Unexamined Patent Application, First Publication No. H05-025565 propose a Cu material having a high residual resistance ratio (RRR).

Japanese Unexamined Patent Application, First Publication No. 2011-236484 proposes a high purity copper having an extremely low impurity concentration in which the amounts of specific elements (Fe, P, Al, As, Sn, and S) are defined.

In addition, Japanese Unexamined Patent Application, First Publication No. H05-025565 proposes a Cu alloy in which small amount of Zr is added to high purity copper having a low oxygen concentration.

Technical Problem

It is known that the residual resistance ratio (RRR) is sufficiently high in an ultrahigh purity copper where the concentrations of the impurity elements are reduced to an extreme level. However, in order to purify copper to such high degree of purity, there are problems in that the manufacturing process becomes extremely complicated, and the manufacturing cost greatly increases.

Here, in Japanese Unexamined Patent Application, First Publication No. 2011-236484, the amounts of specific elements (Fe, P, Al, As, Sn, and S) are limited to less than 0.1 ppm; however, it is not easy to reduce these elements to less than 0.1 ppm, and there is also the problem in that the manufacturing process becomes complicated.

In addition, although the amounts of oxygen and Zr is defined in Japanese Unexamined Patent Application, First Publication No. H05-025565, there are problems in that it is difficult to control the amounts of oxygen and Zr and it is difficult to stably produce a copper alloy having a high residual resistance ratio (RRR).

The present invention has been made in view of the above circumstances, and has an objective of providing a superconducting wire, which is able to be stably used and which is provided with a superconducting stabilization material which is able to be manufactured with a relatively simple and inexpensive manufacturing process and has a sufficiently high residual resistance ratio (RRR), as well as a superconducting coil formed of this superconducting wire.

SUMMARY OF THE INVENTION

Solution to Problem

In order to solve this problem, as a result of extensive research conducted by the present inventors, it was confirmed that among the inevitable impurities, S, Se, and Te in particular exert a negative influence on the residual resistance ratio (RRR), and it was found that it is possible to manufacture a superconducting stabilization material having a high residual resistance ratio (RRR) by adding small amounts of Ca, Sr, Ba, and rare earth (RE) elements to pure copper and fixing S, Se, and Te as a compound.

Based on the above findings, according to a first aspect of the present invention, there is provided a superconducting wire including: a wire formed of a superconducting material; and a superconducting stabilization material disposed in contact with the wire, in which the superconducting stabilization material is formed of a copper material which contains: one or more types of additive elements selected from Ca, Sr, Ba, and rare earth elements in a total of 3 ppm by mass to 400 ppm by mass; and the balance being Cu and inevitable impurities, and in which the total concentration of the inevitable impurities excluding O, H, C, N, and S which are gas components is 5 ppm by mass to 100 ppm by mass.

Here, in the present invention, the rare earth (RE) elements are La, Ce, Pr, Nd, Pm, Sm, Eu, Gd, Tb, Dy, Ho, Er, Tm, Yb, Lu, Sc, and Y.

According to the superconducting wire having the configuration described above, the superconducting stabilization material is formed of a copper material in which one or more types of additive elements selected from Ca, Sr, Ba, and rare earth elements are contained in a total of 3 ppm by mass to 400 ppm by mass in copper where a total concentration of inevitable impurities excluding O, H, C, N, and S which are gas components is 5 ppm by mass to 100 ppm by mass. Therefore, S, Se, and Te in copper are fixed as a compound and it is possible to improve the residual resistance ratio (RRR) of the superconducting stabilization material. In addition, even in a case where the superconducting state is destroyed in a part of the superconducting material, due to the superconducting stabilization material being electrically in contact with the wire formed of a superconducting material, it is possible to divert the electric current flowing in the superconducting material to the superconducting stabilization material and to suppress the transition of the entire superconducting wire to the normal conducting state. Therefore, it is possible to stably use the superconducting wire.

In addition, in the superconducting stabilization material, since copper with the total concentration of inevitable impurities excluding O, H, C, N, and S which are gas components being 5 ppm by mass to 100 ppm by mass is used, there is no need to excessively increase the purity level of the copper, thus the manufacturing process is simplified and it is possible to reduce the manufacturing cost.

Here, in the superconducting wire according to the first aspect of the present invention, the superconducting stabilization material is preferably formed of the copper material with the inevitable impurities in which an Fe content is 10 ppm by mass or less, a Ni content is 10 ppm by mass or less, an As content is 5 ppm by mass or less, a Ag content is 50 ppm by mass or less, a Sn content is 4 ppm by mass or less, an Sb content is 4 ppm by mass or less, a Pb content is 6 ppm by mass or less, a Bi content is 2 ppm by mass or less, and a P content is 3 ppm by mass or less.

Among inevitable impurities, specific elements such as Fe, Ni, As, Ag, Sn, Sb, Pb, Bi, and P have an effect of decreasing the residual resistance ratio (RRR). Therefore, defining the amount of these elements as described above makes it possible to effectively improve the residual resistance ratio (RRR) of the superconducting stabilization material.

In addition, in the superconducting wire according to the first aspect of the present invention, the superconducting stabilization material is preferably formed of the copper material in which a ratio Y/X of a total amount of additive elements of one or more types selected from Ca, Sr, Ba, and rare earth elements (Y ppm by mass) to a total amount of S, Se, and Te (X ppm by mass) is in a range of 0.5≤Y/X≤100.

In this case, since a ratio Y/X of a total amount of additive elements of one or more types selected from Ca, Sr, Ba, and rare earth elements (Y ppm by mass) to a total amount of S, Se, and Te (X ppm by mass) is in the range described above, it is possible for S, Se, and Te in copper to be effectively fixed as a compound with one or more types of additive elements selected from Ca, Sr, Ba, and rare earth elements, and to effectively suppress decreases in the residual resistance ratio (RRR) caused by S, Se, and Te.

Furthermore, in the superconducting wire according to the first aspect of the present invention, the superconducting stabilization material is preferably formed of the copper material in which a compound which contains one or more types of additive elements selected from Ca, Sr, Ba, and rare earth elements and one or more types of elements selected from S, Se, and Te is present.

In this case, S, Se, and Te present in copper are effectively fixed as a compound with one or more types of additive elements selected from Ca, Sr, Ba, and rare earth elements, and it is possible to effectively suppress decreases in the residual resistance ratio (RRR) caused by S, Se, and Te.

In addition, in the superconducting wire according to the first aspect of the present invention, the superconducting stabilization material preferably has a residual resistance ratio (RRR) of 250 or more.

In this case, since the residual resistance ratio (RRR) of the superconducting stabilization material is relatively high at 250 or more, meaning the resistance at extremely low temperatures is sufficiently low, it is possible to sufficiently divert the electric current when the superconducting state of the superconducting material is destroyed, and it is possible to suppress the normal conducting state from propagating to the entire superconducting material.

Furthermore, in the superconducting wire according to the first aspect of the present invention, the superconducting stabilization material is preferably manufactured by a continuous casting rolling method.

In this case, since casting and rolling are carried out continuously, it is possible to obtain a long superconducting stabilization material with high production efficiency.

A superconducting coil according to a second aspect of the present invention has a winding wire part formed by winding the superconducting wire according to the first aspect around an outer surface of a winding frame.

In the superconducting coil with this configuration, since the superconducting wire provided with a superconducting stabilization material having a high residual resistance ratio (RRR) is used as described above, it is possible to stably use the superconducting coil.

Advantageous Effects of Invention

According to the present invention, it is possible to provide a superconducting wire which is able to be stably used and which is provided with a superconducting stabilization material, which is able to be manufactured with a relatively simple and inexpensive manufacturing process and has a sufficiently high residual resistance ratio (RRR), and to provide a superconducting coil formed of this superconducting wire.

DETAILED DESCRIPTION OF THE INVENTION

Description will be given below of a superconducting wire 10 according to one embodiment of the present invention with reference to the accompanying drawings.

Figure 1:
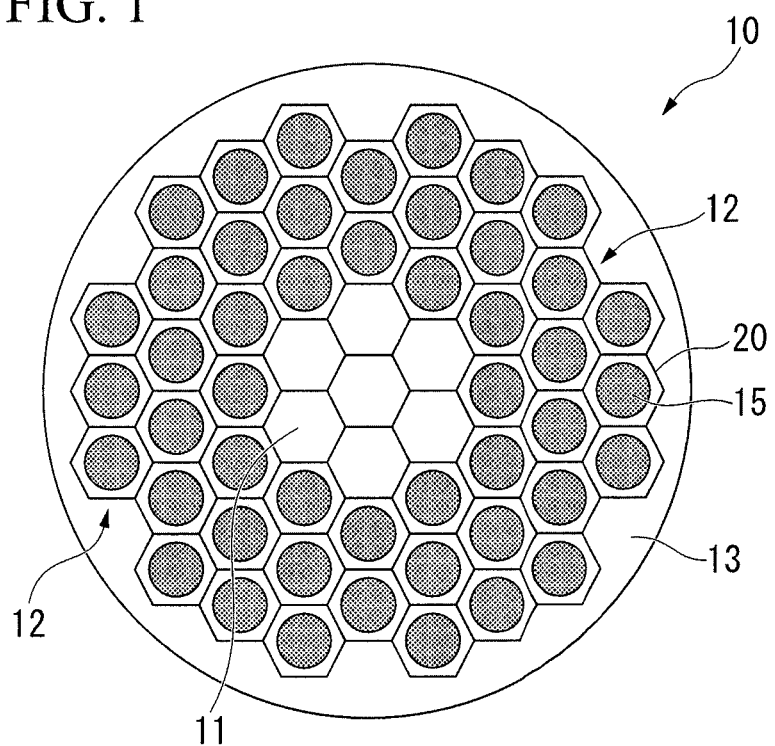
FIG. 1 is a cross-sectional schematic diagram of a superconducting wire according to the present embodiment.

As shown in FIG. 1, the superconducting wire 10 in the present embodiment is provided with a core portion 11, a plurality of filaments 12 disposed on the outer peripheral side of the core portion 11, and an outer shell portion 13 disposed on the outer peripheral side of the plurality of filaments 12.

Figure 2:
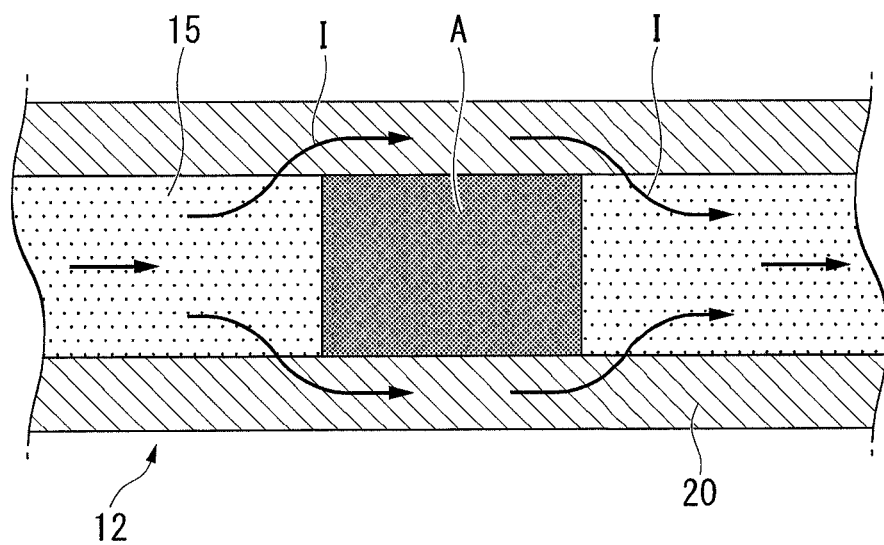
FIG. 2 is a longitudinal sectional schematic diagram of a filament used for the superconducting wire shown in FIG. 1.

In the present embodiment, as shown in FIG. 1 and FIG. 2, the filaments 12 described above have a structure in which a wire 15 formed of a superconducting material is surrounded by a superconducting stabilization material 20 in a state of being electrically in contact therewith. In other words, the wire 15 formed of a superconducting material and the superconducting stabilization material 20 are in a state in which it is possible to conduct electricity.

Here, as shown in FIG. 2, in the superconducting stabilization material 20, in a case where the superconducting state is destroyed in part of the wire 15 formed of a superconducting material, a normal conducting area A is generated and an electric current I flowing through the wire 15 formed of a superconducting material is temporarily diverted.

Then, in the present embodiment, the superconducting stabilization material 20 is formed of a copper material which contains one or more types of additive elements selected from Ca, Sr, Ba, and rare earth elements in a total of 3 ppm by mass to 400 ppm by mass, the balance being Cu and inevitable impurities, and a total concentration of the inevitable impurities excluding O, H, C, N, and S which are gas components being 5 ppm by mass to 100 ppm by mass.

In addition, in the present embodiment, the copper material forming the superconducting stabilization material 20 contains inevitable impurities in which an Fe content is 10 ppm by mass or less, a Ni content is 10 ppm by mass or less, an As content is 5 ppm by mass or less, an Ag content is 50 ppm by mass or less, an Sn content is 4 ppm by mass or less, an Sb content is 4 ppm by mass or less, a Pb content is 6 ppm by mass or less, a Bi content is 2 ppm by mass or less, and a P content is 3 ppm by mass or less.

Furthermore, in the superconducting stabilization material 20 of the present embodiment, a ratio Y/X of a total amount of additive elements of one or more types selected from Ca, Sr, Ba, and rare earth elements (Y ppm by mass) to a total amount of S, Se, and Te (X ppm by mass) is in a range of $0.5 \leq Y/X \leq 100$.

In addition, in the present embodiment, the copper material forming the superconducting stabilization material 20 includes a compound which contains: one or more types of additive elements selected from Ca, Sr, Ba, and rare earth elements; and one or more types of elements selected from S, Se, and Te.

Furthermore, in the present embodiment, the superconducting stabilization material 20 has a residual resistance ratio (RRR) of 250 or more.

Here, description will be given below of the reasons for defining the component composition of the superconducting stabilization material 20, the presence or absence of compounds, and the residual resistance ratio (RRR) as described above.

(One or More Types of Additive Elements Selected from Ca, Sr, Ba, and Rare Earth Elements)

Among the inevitable impurities contained in the copper, S, Se, and Te are elements which form solid solutions in copper, greatly decreasing the residual resistance ratio (RRR). Therefore, in order to improve the residual resistance ratio (RRR), it is necessary to eliminate the influence of S, Se, and Te.

Here, since one or more types of additive elements selected from Ca, Sr, Ba, and rare earth elements are elements which are highly reactive with S, Se, and Te, by creating a compound with S, Se, and Te it is possible to suppress S, Se, and Te from forming a solid solution in copper. Due to this, it is possible to sufficiently improve the residual resistance ratio (RRR) of the superconducting stabilization material 20.

Here, since one or more types of additive elements selected from Ca, Sr, Ba, and rare earth elements are elements which do not easily form a solid solution in copper and which have a small effect of decreasing the residual resistance ratio (RRR) even in a case of forming a solid solution in copper, the residual resistance ratio (RRR) of the superconducting stabilization material 20 does not decrease greatly even in a case where these additive elements are excessively added with respect to the amount of the S, Se, and Te.

Here, in a case where the amount of one or more types of additive elements selected from Ca, Sr, Ba, and rare earth elements is less than 3 ppm by mass, there is a concern that it will not be possible to sufficiently fix S, Se, and Te. On the other hand, in a case where the amount of one or more types of additive elements selected from Ca, Sr, Ba, and rare earth elements exceeds 400 ppm by mass, there is a concern that coarse precipitates or the like of these additive elements will form, which deteriorates the workability. From the above description, in the present embodiment, the amount of one or more types of additive elements selected from Ca, Sr, Ba, and rare earth elements is defined within the range of 3 ppm by mass to 400 ppm by mass.

Here, in order to effectively fix S, Se, and Te, the amount of one or more types of additive elements selected from Ca, Sr, Ba, and rare earth elements is preferably 3.5 ppm by mass or more, and more preferably 4.0 ppm by mass or more. On the other hand, in order to effectively suppress decrease in workability, the amount of one or more types of additive elements selected from Ca, Sr, Ba, and rare earth elements is preferably 300 ppm by mass or less, and more preferably 100 ppm by mass or less.

(Inevitable Impurity Elements Excluding Gas Components)

Lowering the concentrations of inevitable impurities excluding gas components (O, H, C, N, and S) improves the residual resistance ratio (RRR). On the other hand, in a case where there is an attempt to reduce the concentration of inevitable impurities more than necessary, the manufacturing process becomes complicated whereby the manufacturing cost drastically increases. Therefore, in the present embodiment, the concentrations of inevitable impurities excluding gas components (O, H, C, N, and S) are set within the range of 5 ppm by mass to 100 ppm by mass in total.

In order to set the concentration of inevitable impurities excluding the gas components (O, H, C, N, and S) within a range of 5 ppm by mass to 100 ppm by mass in total, it is possible to use high purity copper with a purity of 99 to 99.9999 mass % or oxygen free copper (C10100 and C10200) as a raw material. However, since Ca, Sr, Ba, and rare earth elements react with O in a case there is a high O concentration, the O concentration is preferably 20 ppm by mass or less, and more preferably 10 ppm by mass or less. The O concentration is even more preferably 5 ppm by mass or less.

Here, in order to effectively suppress the increase in the manufacturing cost of the superconducting stabilization material 20, the inevitable impurities is preferably 7 ppm by mass or more, and more preferably 10 ppm by mass or more. On the other hand, in order to effectively improve the residual resistance ratio (RRR) of the superconducting stabilization material 20, the inevitable impurities is preferably 90 ppm by mass or less, and more preferably 80 ppm by mass or less.

Here, inevitable impurities in the present embodiment are Fe, Ni, As, Ag, Sn, Sb, Pb, Bi, P, Li, Be, B, F, Na, Mg, Al, Si, Cl, K, Ti, V, Cr, Mn, Nb, Co, Zn, Ga, Ge, Br, Rb, Zr, Mo, Ru, Pd, Cd, In, I, Cs, Hf, Ta, W, Re, Os, Ir, Pt, Au, Hg, Tl, Th, and U.

(Fe, Ni, As, Ag, Sn, Sb, Pb, Bi, and P)

Since specific elements such as Fe, Ni, As, Ag, Sn, Sb, Pb, Bi, and P among the inevitable impurities have an effect of decreasing the residual resistance ratio (RRR) of the superconducting stabilization material 20, defining the amount of each of these elements makes it possible to effectively suppress decreases in the residual resistance ratio (RRR) of the superconducting stabilization material 20. Therefore, in the present embodiment, the Fe content is defined as 10 ppm by mass or less, the Ni content as 10 ppm by mass or less, the As content as 5 ppm by mass or less, the Ag content as 50 ppm by mass or less, the Sn content as 4 ppm by mass or less, the Sb content as 4 ppm by mass or less, the Pb content as 6 ppm by mass or less, the Bi content as 2 ppm by mass or less, and the P content as 3 ppm by mass or less.

In order to more effectively suppress decreases in the residual resistance ratio (RRR) of the superconducting stabilization material 20, it is preferable to define the Fe content as 4.5 ppm by mass or less, the Ni content as 3 ppm by mass or less, the As content as 3 ppm by mass or less, the Ag content as 38 ppm by mass or less, the Sn content as 3 ppm by mass or less, the Sb content as 1.5 ppm by mass or less, the Pb content as 4.5 ppm by mass or less, the Bi content as 1.5 ppm by mass or less, and the P content as 1.5 ppm by mass or less, and more preferably the Fe content as 3.3 ppm by mass or less, the Ni content as 2.2 ppm by mass or less, the As content as 2.2 ppm by mass or less, the Ag content as 28 ppm by mass or less, the Sn content as 2.2 ppm by mass or less, the Sb content as 1.1 ppm by mass or less, the Pb content as 3.3 ppm by mass or less, the Bi content as 1.1 ppm by mass or less, and the P content as 1.1 ppm by mass or less. The lower limit of the amount of Fe, Ni, As, Ag, Sn, Sb, Pb, Bi, and P is 0 ppm by mass. In addition, since there is a concern that excessive reduction of the above may result in an increase in the manufacturing cost, it is preferable to set the Fe content as 0.1 ppm by mass or more, the Ni content as 0.1 ppm by mass or more, the As content as 0.1 ppm by mass or more, the Ag content as 0.1 ppm by mass or more, the Sn content as 0.1 ppm by mass or more, the Sb content as 0.1 ppm by mass or more, the Pb content as 0.1 ppm by mass or more, the Bi content as 0.1 ppm by mass or more, and the P content as 0.1 ppm by mass or more, without being limited thereto.

(Ratio Y/X of Total Amount of Additive Elements to Total Amount of S, Se, and Te)

As described above, one or more types of additive elements selected from Ca, Sr, Ba, and rare earth elements form compounds with elements such as S, Se, and Te. Here, in a case where the ratio Y/X of the total amount of additive elements (Y ppm by mass) to the total amount of S, Se, and Te (X ppm by mass) is less than 0.5, the amount of additive elements is insufficient, and there is a concern that it may not be possible to sufficiently fix the elements such as S, Se, and Te.

On the other hand, in a case where the ratio Y/X of the total amount of additive elements to the total amount of S, Se, and Te exceeds 100, there may be an excess of additive elements not reacting with S, Se and Te, and this causes a concern that the workability may be deteriorated.

From the above, in the present embodiment, the ratio Y/X of the total amount of additive elements to the total amount of S, Se, and Te is defined within the range of 0.5 to 100.

Here, in order to effectively fix the elements such as S, Se, and Te as a compound, the ratio Y/X of the total amount of additive elements to the total amount of S, Se, and Te is preferably 0.75 or more, and more preferably 1.0 or more. In addition, in order to effectively suppress decreases in workability, the ratio Y/X of the total amount of additive elements to the total amount of S, Se, and Te is preferably 75 or less, and more preferably 50 or less. Here, the total amount of S, Se, and Te in the superconducting stabilization material 20 is preferably more than 0 ppm by mass and 25 ppm by mass or less, without being limited thereto.

(Compound Containing Additional Element and One or More Types of Elements Selected from S, Se, and Te)

As described above, one or more types of additive elements selected from Ca, Sr, Ba, and rare earth elements form compounds with elements such as S, Se, and Te so as to suppress elements such as S, Se, and Te from forming solid solutions in the copper. Thus, compounds containing one or more types of additive elements selected from Ca, Sr, Ba, and rare earth elements and one or more types of elements selected from S, Se, and Te are present, and thereby it is possible to effectively improve the residual resistance ratio (RRR) of the superconducting stabilization material 20.

Here, when compounds containing one or more types of additive elements selected from Ca, Sr, Ba, and rare earth elements and elements such as S, Se, and Te are present in a number density of $0.001/\mu m^2$ or more, it is possible to effectively improve the residual resistance ratio (RRR). In addition, in order to further improve the residual resistance ratio (RRR), it is preferable to set the number density of the compounds to $0.005/\mu m^2$ or more. The number density is more preferably $0.007/\mu m^2$ or more. In the present embodiment, the number density described above relates to a compound having a particle diameter of 0.1 μm or more.

In the present embodiment, since the amount of elements such as S, Se, and Te is sufficiently small, the number density of the compound described above (particle diameter of 0.1 μm or more) is $0.1/\mu m^2$ or less, and more preferably $0.09/\mu m^2$ or less. The number density is even more preferably $0.08/\mu m^2$ or less.

(Residual Resistance Ratio (RRR))

Since the residual resistance ratio (RRR) of the superconducting stabilization material 20 according to the present embodiment is 250 or more, the resistance value is low at extremely low temperatures and it is possible to effectively divert the electric current. The residual resistance ratio (RRR) is preferably 280 or more, and more preferably 300 or more. The residual resistance ratio (RRR) is even more preferably 400 or more. Here, it is preferable to set the residual resistance ratio (RRR) to 10000 or less, without being limited thereto.

Here, the superconducting stabilization material 20 described above is manufactured by a manufacturing process including a melting casting process, a plastic working process, and a heat treatment process.

A copper wire rod having the composition shown in the present embodiment may be manufactured by a continuous casting rolling method (for example, Southwire Continuous Rod (SCR) system) or the like, and the superconducting stabilization material 20 may be manufactured using this rod as a base material. In this case, the production efficiency of the superconducting stabilization material 20 is improved, and it is possible to greatly reduce the manufacturing cost. The continuous casting rolling method referred to here is a process in which a copper wire rod is manufactured using a continuous casting rolling facility provided with a belt-wheel type continuous casting apparatus and a continuous rolling device, and a drawn copper wire is manufactured using this copper wire rod as a material.

The superconducting wire 10 of the present embodiment formed as described above includes: the wire 15 formed of a superconducting material; and the superconducting stabilization material 20 disposed in contact with the wire 15, and the superconducting stabilization material 20 is formed of a copper material in which one or more types of additive elements selected from Ca, Sr, Ba, and rare earth elements are contained in a total of 3 ppm by mass to 400 ppm by mass in copper where the total concentration of inevitable impurities excluding O, H, C, N, and S which are gas components is 5 ppm by mass to 100 ppm by mass. Thus, S, Se, and Te in copper are fixed as a compound and it is possible to improve the residual resistance ratio (RRR) of the superconducting stabilization material 20. In addition, by the superconducting stabilization material being electrically in contact with the wire formed of the superconducting material, even in a case where the normal conducting area A in which the superconducting state is destroyed is generated in the wire 15 formed of the superconducting material, it is possible to effectively divert the electric current to the superconducting stabilization material 20. Therefore, it is possible to suppress the transition of the entire superconducting wire 10 to the normal conducting state, and it is possible to stably use the superconducting wire 10 according to the present embodiment.

In addition, since copper where the total concentration of inevitable impurities excluding O, H, C, N, and S which are gas components is 5 ppm by mass to 100 ppm by mass is used, there is no need to excessively increase the purity level of the copper, the manufacturing process is simplified, and it is possible to reduce the manufacturing cost of the superconducting stabilization material 20.

Further, in the present embodiment, since the amounts of Fe, Ni, As, Ag, Sn, Sb, Pb, Bi, and P which influence the residual resistance ratio (RRR) are defined such that the Fe content is 10 ppm by mass or less, the Ni content is 10 ppm by mass or less, the As content is 5 ppm by mass or less, the Ag content is 50 ppm by mass or less, the Sn content is 4 ppm by mass or less, the Sb content is 4 ppm by mass or less, the Pb content is 6 ppm by mass or less, the Bi content is 2 ppm by mass or less, and the P content is 3 ppm by mass or less, it is possible to effectively improve the residual resistance ratio (RRR) of the superconducting stabilization material 20.

In addition, in the present embodiment, since a ratio Y/X of a total amount of additive elements of one or more types selected from Ca, Sr, Ba, and rare earth elements (Y ppm by mass) to a total amount of S, Se, and Te (X ppm by mass) is within the range of $0.5 \leq Y/X \leq 100$, it is possible to effectively fix S, Se, and Te in copper as a compound with additive elements, and it is possible to effectively suppress decreases in the residual resistance ratio (RRR). In addition, without large amounts of excess additive elements which do not react with S, Se and Te, it is possible to ensure the workability of the superconducting stabilization material 20.

Furthermore, in the present embodiment, since there is a compound which contains one or more types of additive elements selected from Ca, Sr, Ba, and rare earth elements and one or more types of elements selected from S, Se, and Te, the S, Se, and Te present in copper are effectively fixed by a compound with one or more types of additive elements selected from Ca, Sr, Ba, and rare earth elements, and it is possible to effective suppress decreases in the residual resistance ratio (RRR) of the superconducting stabilization material 20 caused by S, Se, and Te.

In particular, in the present embodiment, since the number density of the compounds having a particle diameter of 0.1 µm or more is $0.001/\mu m^2$ or more, it is possible to effectively fix S, Se, and Te as a compound, and to sufficiently improve the residual resistance ratio (RRR) of the superconducting stabilization material 20.

In addition, in the present embodiment, since the residual resistance ratio (RRR) of the superconducting stabilization material 20 is relatively high at 250 or more, the resistance value at extremely low temperatures is sufficiently low. Therefore, even in a case when the superconducting state is destroyed and a normal conducting area A is generated in the wire 15 formed of the superconducting material, it is possible to effectively divert the electric current to the superconducting stabilization material 20.

Although the superconducting wire according to the embodiment of the present invention was described above, the present invention is not limited thereto but is able to be appropriately modified in a range not departing from the technical idea of the invention.

For example, the core portion 11 and the outer shell portion 13 forming the superconducting wire 10 may also be formed of a copper material having the same composition as that of the superconducting stabilization material 20 of the present embodiment.

Figure 3:
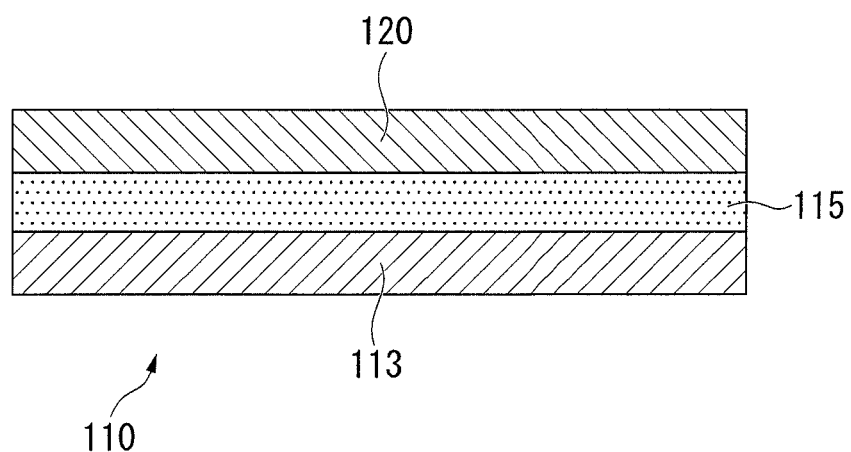
FIG. 3 is a schematic diagram of a superconducting wire according to another embodiment.

In addition, in the embodiment described above, as shown in FIG. 1, the superconducting wire 10 having a structure in which the plurality of filaments 12 are bundled is described as an example, but the present invention is not limited thereto, for example, as shown in FIG. 3, the superconducting wire may be a superconducting wire 110 having a structure in which a superconducting material 115 and a superconducting stabilization material 120 are laminated and disposed on a tape-like substrate 113.

EXAMPLE

Description will be given below of the results of confirmatory experiments conducted to confirm the effect of the present invention.

In the examples, as a laboratory experiment, high purity copper having a purity of 99.9999 mass % and a master alloy of Ca, Sr, Ba, and rare earth (RE) elements were used as raw materials, and adjustments were carried out to obtain the compositions shown in Table 1. In addition, for Fe, Ni, As, Ag, Sn, Sb, Pb, Bi, P, and other impurities, a master alloy of each element was prepared from Fe, Ni, As, Ag, Sn, Sb, Pb, Bi, and P having a purity of 99.9 mass % or more and pure copper having a purity of 99.9 mass % and adjustments were carried out using the master alloys. First, high purity copper was melted using an electric furnace in a reducing atmosphere of $N_2$+CO and master alloys of various additive elements and impurities were added thereto thereby adjusting the concentrations thereof to be a predetermined concentration, and then the resultant was casted into a predetermined mold. Thereby, an ingot with a diameter of 70 mm and a length of 150 mm was obtained. Mischmetal was used as part of the raw material for a rare earth master alloy. Square material having cross-sectional size of 25 mm×25 mm was cut out from this ingot and subjected to hot rolling at 850° C. to obtain a hot rolled wire having a diameter of 8 mm, and a thin wire with a diameter of 2.0 mm was formed from this hot-rolled wire by cold rolling, and subjected to strain relief annealing of being maintained at 500° C. for 1 hour to produce the evaluation wire shown in Table 1. Here, in this example, the mixing in of impurity elements was also observed in the process of melting and casting.

Using these evaluation wires, the following items were evaluated.

(Residual Resistance Ratio (RRR))

Using the four terminal method, the electrical specific resistance ($\rho_{293\,K}$) at 293 K and the electrical specific resistance ($\rho_{4.2\,K}$) at the temperature of liquid helium (4.2 K) was measured and RRR=$\rho_{293K}/\rho_{4.2K}$ was calculated.

(Composition Analysis)

Using the sample from which the residual resistance ratio (RRR) was measured, component analysis was carried out as follows. For elements excluding gas components, glow discharge mass spectrometry was used in a case of being less than 10 ppm by mass and an inductively coupled plasma atomic emission spectrometry was used in a case of being 10 ppm or more. In addition, an infrared absorption method was used for analysis of S. The measured O concentrations were all 10 ppm by mass or less. Here, for the analysis of O, the infrared absorption method was used.

(Observation of Compound Particles)

In order to confirm the presence or absence of compound particles containing one or more types of additive elements selected from Ca, Sr, Ba, and rare earth elements and one or more types of S, Se, and Te, particle observation was performed using a scanning electron microscope (SEM), and energy dispersive X-ray spectrometry (EDX).

In addition, in order to evaluate the number density (number/$\mu m^2$) of the compounds, an area where the dispersion state of the compounds is not unique was observed at 10000 times magnification (observation field: $2\times10^8$ $nm^2$), and 10 observation fields (total observation field: $2\times10^9$ $nm^2$) were analyzed. The particle diameter of the compound was the average length along the major axis of the compound (the maximum length of a straight line which could be drawn in the particle on the condition of not coming into contact with the particle boundary while being drawn) and the minor axis (the maximum length of a straight line which could be drawn in the direction orthogonal to the major axis on the condition of not coming into contact with the particle boundary while being drawn). Then, the number density (number/$\mu m^2$) of the compounds having a particle diameter of 0.1 pm or more was determined.

Figure 4:
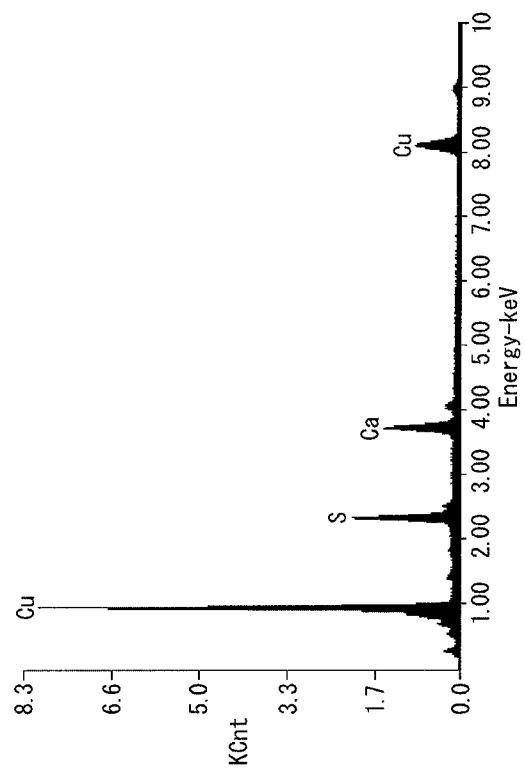
FIG. 4 is diagrams showing (a) SEM observation result and (b) analysis result of the compound of the superconducting stabilization material of Invention Example 4 in the Examples.
Figure 4:
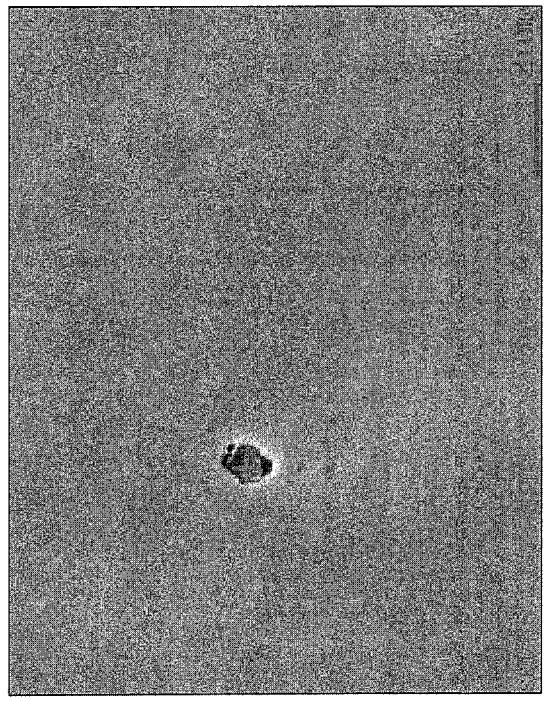
Figure 5:
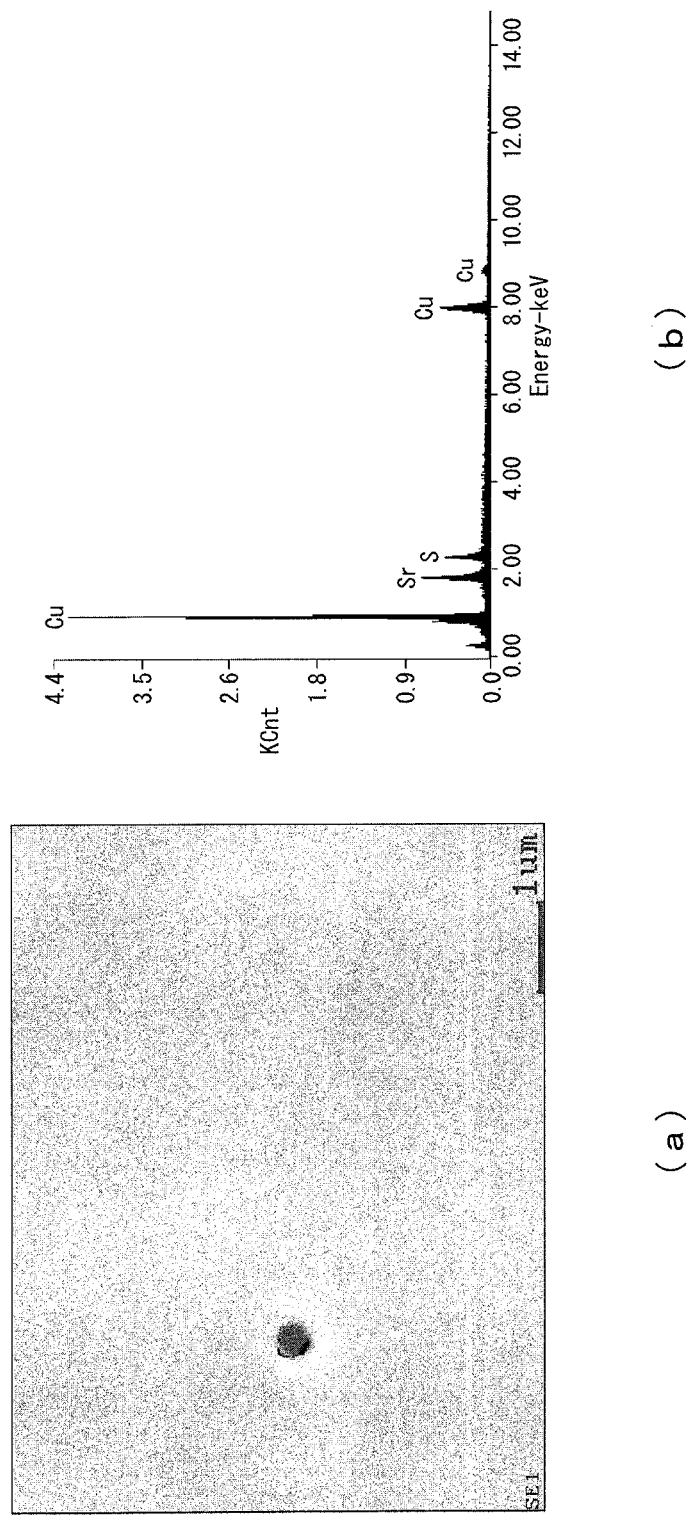
FIG. 5 is diagrams showing (a) SEM observation result and (b) analysis result of the compound of the superconducting stabilization material of Invention Example 10 in the Examples.
Figure 6:
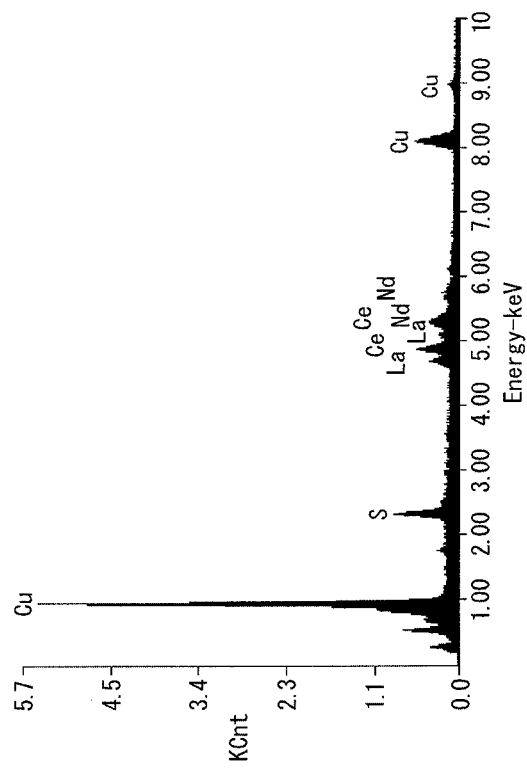
FIG. 6 is diagrams showing (a) SEM observation result and (b) analysis result of the compound of the superconducting stabilization material of Invention Example 19 in the Examples.
Figure 6:
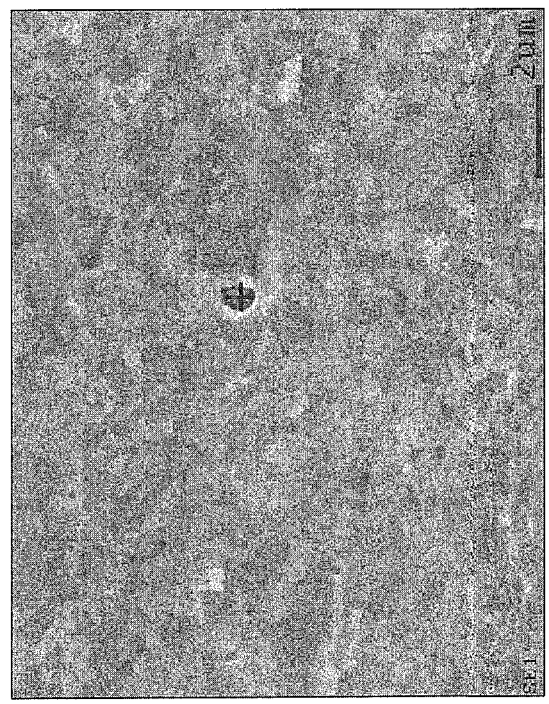

The evaluation results are shown in Table 1. In addition, FIG. 4 shows (a) SEM observation results and (b) analysis results (EDX analysis results) of the compound of Invention Example 4, FIG. 5 shows (a) SEM observation results of the compound and (b) analysis results (EDX analysis results) of Invention Example 10, and FIG. 6 shows (a) SEM observation results and (b) analysis results (EDX analysis results) of the compound of Invention Example 19. Also, FIG. 4(*b*), FIG. 5(*b*), and FIG. 6(*b*) show the spectra of the compounds marked with "+" in each of FIG. 4(*a*), FIG. 5(*a*), and FIG. 6(*b*).

TABLE 1

| | | Additive Elements (ppm by mass) | | | | | Impurities (ppm by mass) | | | | |
| --- | --- | --- | --- | --- | --- | --- | --- | --- | --- | --- | --- |
| | | | | | | | Total concentration of inevitable impurities excluding O, H, C, N, and S | | | | Total amount X of S, Se, and Te |
| | | Ca | Sr | Ba | RE | Total amount Y of Ca, Sr, Ba, and RE | | S | Se | Te | |
| Invention Example | 1 | 3 | — | — | — | 3 | 13.3 | 5.5 | 1.1 | 1.2 | 7.8 |
| | 2 | 4 | — | — | — | 4 | 32.8 | 5.0 | 0.6 | 0.4 | 6.0 |
| | 3 | 12 | — | — | — | 12 | 15.6 | 4.2 | 1.0 | 0.8 | 6.0 |
| | 4 | 26 | — | — | — | 26 | 40.4 | 5.2 | 0.5 | 1.0 | 6.7 |
| | 5 | 53 | — | — | — | 53 | 28.0 | 5.8 | 0.6 | 1.0 | 7.4 |
| | 6 | 66 | — | — | — | 66 | 15.7 | 4.4 | 0.9 | 0.5 | 5.8 |
| | 7 | 95 | — | — | — | 95 | 75.7 | 5.1 | 0.9 | 0.6 | 6.6 |
| | 8 | 233 | — | — | — | 233 | 92.0 | 5.5 | 1.1 | 0.9 | 7.5 |
| | 9 | 384 | — | — | — | 384 | 66.1 | 5.6 | 0.9 | 0.7 | 7.2 |
| | 10 | — | 13 | 13 | — | — | 46.0 | 4.3 | 0.8 | 1.1 | 6.2 |
| | 11 | — | 35 | — | — | 35 | 25.3 | 7.5 | 0.7 | 0.6 | 8.8 |
| | 12 | — | 71 | — | — | 71 | 20.0 | 5.4 | 0.8 | 0.2 | 6.4 |
| | 13 | — | 164 | — | — | 164 | 32.0 | 7.2 | 1.3 | 0.9 | 9.4 |
| | 14 | — | — | 11 | — | 11 | 33.9 | 4.5 | 0.6 | 0.8 | 5.9 |
| | 15 | — | — | 54 | — | 54 | 20.1 | 5.2 | 1.1 | 0.5 | 6.8 |
| | 16 | — | — | 102 | — | 102 | 87.5 | 4.6 | 0.9 | 0.9 | 6.4 |
| | 17 | — | — | 135 | — | 135 | 46.0 | 7.7 | 1.2 | 1.0 | 9.9 |
| | 18 | — | — | — | Ce:13 | 13 | 27.7 | 7.5 | 0.5 | 0.6 | 8.6 |
| | 19 | — | — | — | *3MM:51 | 51 | 19.8 | 7.3 | 1.2 | 0.9 | 9.4 |
| | 20 | — | — | — | Nd:89 | 89 | 50.2 | 3.7 | 1.2 | 1.1 | 6.0 |
| | 21 | 32 | — | — | La:32 | 32 | 5.5 | 0.9 | 0.2 | 0.2 | 1.3 |
| | 22 | — | 18 | — | — | 18 | 5.7 | 0.4 | 0.1 | 0.1 | 0.5 |
| Comparative Example | 1 | 15 | 5 | — | — | 20 | 171.4 | 5.0 | 1.0 | 0.4 | 6.4 |
| | 2 | — | — | — | — | 0 | 48.2 | 4.6 | 0.8 | 0.9 | 6.3 |
| | 3 | 1030 | — | — | — | 1030 | 41.4 | 3.6 | 0.4 | 0.4 | 4.4 |

TABLE 1-continued

| | | Impurities (ppm by mass) Specific impurities | | | | | | | | | | Number*2 | |
|---|---|---|---|---|---|---|---|---|---|---|---|---|---|
| | | Fe | Ni | As | Ag | Sn | Sb | Pb | Bi | P | Cu | Y/X*1 | density | RRR |
| Invention Example | 1 | 1.2 | 1.1 | 1.0 | 6 | 0.1 | 0.1 | 0.1 | 0.1 | 0.1 | Balance | 0.4 | 0.00188 | 365 |
| | 2 | 6.8 | 2.8 | 1.2 | 13 | 0.8 | 1.2 | 1.2 | 0.4 | 1.4 | Balance | 0.7 | 0.00250 | 255 |
| | 3 | 0.6 | 1.0 | 0.5 | 9 | 0.1 | 0.3 | 0.8 | 0.2 | 0.1 | Balance | 2.0 | 0.00750 | 452 |
| | 4 | 2.3 | 2.4 | 1.2 | 21 | 1.1 | 0.5 | 4.8 | 0.8 | 1.5 | Balance | 3.9 | 0.01625 | 482 |
| | 5 | 1.5 | 2.8 | 0.8 | 13 | 1.8 | 1.0 | 1.8 | 0.7 | 0.8 | Balance | 7.2 | 0.01872 | 639 |
| | 6 | 0.6 | 1.0 | 0.5 | 9 | 0.1 | 0.3 | 0.7 | 0.2 | 0.1 | Balance | 11.4 | 0.01470 | 732 |
| | 7 | 7.0 | 5.7 | 3.4 | 39 | 2.6 | 3.2 | 3.3 | 1.3 | 1.8 | Balance | 14.4 | 0.01672 | 310 |
| | 8 | 9.9 | 8.7 | 4.3 | 42 | 3.9 | 3.2 | 4.9 | 1.9 | 2.8 | Balance | 31.1 | 0.01900 | 282 |
| | 9 | 3.0 | 1.8 | 0.6 | 48 | 0.4 | 1.2 | 1.2 | 1.0 | 1.2 | Balance | 53.4 | 0.01822 | 324 |
| | 10 | 2.5 | 2.8 | 1.5 | 28 | 1.1 | 1.2 | 1.8 | 0.7 | 0.7 | Balance | 2.1 | 0.00813 | 355 |
| | 11 | 0.6 | 6.6 | 0.5 | 12 | 0.1 | 0.3 | 0.7 | 0.9 | 0.1 | Balance | 4.0 | 0.02188 | 547 |
| | 12 | 1.1 | 1.0 | 1.4 | 10 | 0.1 | 0.2 | 1.4 | 0.9 | 1.1 | Balance | 11.1 | 0.01619 | 643 |
| | 13 | 1.9 | 2.6 | 2.3 | 15 | 0.5 | 0.8 | 1.6 | 1.7 | 0.9 | Balance | 17.5 | 0.02379 | 424 |
| | 14 | 2.4 | 2.0 | 1.3 | 20 | 0.3 | 0.8 | 1.6 | 0.4 | 1.0 | Balance | 1.9 | 0.00688 | 353 |
| | 15 | 0.6 | 1.0 | 4.8 | 9 | 0.1 | 0.3 | 0.8 | 0.2 | 0.1 | Balance | 8.0 | 0.01720 | 503 |
| | 16 | 8.7 | 6.8 | 3.9 | 44 | 2.9 | 3.2 | 4.4 | 1.5 | 2.3 | Balance | 15.9 | 0.01622 | 293 |
| | 17 | 2.6 | 1.3 | 2.1 | 25 | 1.3 | 3.9 | 1.9 | 0.8 | 1.1 | Balance | 13.7 | 0.02506 | 438 |
| | 18 | 4.1 | 0.9 | 1.8 | 13 | 1.3 | 0.4 | 1.5 | 1.0 | 0.5 | Balance | 1.5 | 0.00813 | 319 |
| | 19 | 0.7 | 0.8 | 0.4 | 9 | 3.3 | 0.3 | 0.9 | 0.3 | 0.2 | Balance | 5.4 | 0.02379 | 677 |
| | 20 | 6.0 | 1.1 | 0.6 | 31 | 0.4 | 0.7 | 1.0 | 0.3 | 2.6 | Balance | 14.9 | 0.01518 | 452 |
| | 21 | 0.6 | 0.2 | 0.1 | 3 | 0.2 | 0.2 | 0.4 | 0.1 | 0.4 | Balance | 25.4 | 0.00319 | 969 |
| | 22 | 2.1 | 0.1 | 0.2 | 2 | 0.2 | 0.1 | 0.1 | 0.1 | 0.2 | Balance | 33.4 | 0.00137 | 1181 |
| Comparative Example | 1 | 4.1 | 27.0 | 5.9 | 85 | 3.3 | 3.1 | 4.1 | 3.8 | 5.1 | Balance | 3.1 | 0.01250 | 106 |
| | 2 | 2.1 | 2.5 | 2.5 | 30 | 0.5 | 0.9 | 1.3 | 0.7 | 2.0 | Balance | 0.0 | 0.00000 | 218 |
| | 3 | 2.6 | 0.9 | 1.8 | 25 | 0.8 | 0.7 | 1.8 | 0.7 | 2.9 | Balance | 234.6 | — | — |

*1Y/X: Ratio of a total amount of additive elements (Y ppm by mass) to a total amount of S, Se, and Te (X ppm by mass)
*2Number density (number/μm2) of compounds with a particle diameter of 0.1 μm or more
*3MM: Mischmetal In Comparative Example 1, the total amount of inevitable impurities excluding the gas components (O, H, C, N, and S) exceeded 100 ppm by mass and the residual resistance ratio (RRR) was relatively low at 106.

In Comparative Example 2, one or more types of additive elements selected from Ca, Sr, Ba, and rare earth (RE) elements were not added, and the residual resistance ratio (RRR) was relatively low at 218.

In Comparative Example 3, the added amount of Ca exceeded the range of the present invention at 1030 ppm by mass, and breaking occurred during plastic working. For this reason, measurement of the residual resistance ratio (RRR) and observation of the particles were not performed.

In contrast, in Invention Examples 1 to 22, the residual resistance ratio (RRR) was 250 or more, and it was confirmed that Example 1 to 22 is particularly suitable as a superconducting stabilization material.

In addition, as shown in FIG. 4, in a case where Ca was added, a compound containing Ca and S was observed.

Furthermore, as shown in FIG. 5, in a case where Sr was added, a compound containing Sr and S was observed.

Furthermore, as shown in FIG. 6, in a case where rare earth elements were added, a compound of rare earth elements and S was observed.

From the above, it was confirmed that, according to the present invention, it was possible to provide a superconducting wire which was provided with a superconducting stabilization material which was able to be manufactured with a relatively simple and inexpensive manufacturing process and which had a sufficiently high residual resistance ratio (RRR).

INDUSTRIAL APPLICABILITY

According to the present invention, it is possible to provide a superconducting wire which is able to be stably used and which is provided with a superconducting stabilization material, which is able to be manufactured with a relatively simple and inexpensive manufacturing process and has a sufficiently high residual resistance ratio (RRR).

REFERENCE SIGNS LIST 10, 110 SUPERCONDUCTING WIRE
20, 120 SUPERCONDUCTING STABILIZATION MATERIAL

The invention claimed is:

1. A superconducting wire comprising:
a wire formed of a superconducting material; and
a superconducting stabilization material disposed in contact with the wire, wherein
the superconducting stabilization material is formed of a copper material which contains: one or more additive elements selected from Ca, Sr, and Ba in a total of 3 ppm by mass to 400 ppm by mass; and a balance being Cu and inevitable impurities, and in which a total concentration of the inevitable impurities excluding O, H, C, N, and S which are gas components is 5 ppm by mass to 100 ppm by mass.

2. The superconducting wire according to claim 1, wherein the inevitable impurities comprise; Fe in a range of 10 ppm by mass or less, Ni in a range of 10 ppm by mass or less, As in a range of 5 ppm by mass or less, Ag in a range of 50 ppm by mass or less, Sn in a range of 4 ppm by mass or less, Sb in a range of 4 ppm by mass or less, Pb in a range of 6 ppm by mass or less, Bi in a range of 2 ppm by mass or less, and P in a range of 3 ppm by mass or less.

3. The superconducting wire according to claim 1, wherein the superconducting stabilization material is formed of the copper material in which a ratio Y/X of the total amount of the one or more additive elements (Y ppm by mass) to a total amount of S, Se, and Te (X ppm by mass) is in a range of $0.5 \leq Y/X \leq 100$.

4. The superconducting wire according to claim 1, wherein the superconducting stabilization material is formed of the copper material in which a compound which contains the one or more additive elements selected and one or more elements selected from S, Se, and Te is present.

5. The superconducting wire according to claim 1, wherein the superconducting stabilization material has a residual resistance ratio (RRR) of 250 or more.

6. The superconducting wire according to claim 1, wherein the superconducting stabilization material is manufactured by a continuous casting rolling method.

7. A superconducting coil comprising:
a winding wire part formed by winding the superconducting wire according to claim 1 around an outer surface of a winding frame.

8. The superconducting wire according to claim 1, wherein
the one or more additive elements further comprises at least one element selected from rare earth elements in an amount of 32 ppm or less.

* * * * *